(12) United States Patent
Craig et al.

(10) Patent No.: US 11,784,281 B2
(45) Date of Patent: Oct. 10, 2023

(54) METHOD AND APPARATUS TO ADD LIGHT SOURCES TO A PRINT

(71) Applicant: Xerox Corporation, Norwalk, CT (US)

(72) Inventors: David C. Craig, Pittsford, NY (US); Ka Hei Fung, Webster, NY (US); Brendan McNamara, West Henrietta, NY (US)

(73) Assignee: Xerox Corporation, Norwalk, CT (US)

( * ) Notice: Subject to any disclaimer, the term of this patent is extended or adjusted under 35 U.S.C. 154(b) by 272 days.

(21) Appl. No.: 17/127,458

(22) Filed: Dec. 18, 2020

(65) Prior Publication Data

US 2022/0199851 A1  Jun. 23, 2022

(51) Int. Cl.
| | |
|---|---|
| *G02B 6/00* | (2006.01) |
| *H01L 33/00* | (2010.01) |
| *H01L 33/60* | (2010.01) |
| *F21V 8/00* | (2006.01) |
| *G02B 6/42* | (2006.01) |
| *H01L 25/075* | (2006.01) |

(52) U.S. Cl.
CPC .............. *H01L 33/005* (2013.01); *G02B 6/00* (2013.01); *G02B 6/0035* (2013.01); *G02B 6/0063* (2013.01); *G02B 6/0065* (2013.01); *G02B 6/4239* (2013.01); *H01L 33/60* (2013.01); *H01L 25/0753* (2013.01); *H01L 2933/0058* (2013.01)

(58) Field of Classification Search
CPC .. G02B 6/0035; G02B 6/0065; G02B 6/0063; G02B 6/00; G02B 6/006; G02B 2027/0112; G02B 5/20; G02B 27/0172; G02B 5/02; G02B 6/0055; G02B 6/005; H01L 33/60; G09F 2013/222; G09F 13/18; G09F 13/04; G09F 13/10; G09F 19/22; B41M 5/0047; B41M 5/0064; B41M 5/007; B44F 1/045; G02C 11/04
See application file for complete search history.

(56) References Cited

U.S. PATENT DOCUMENTS

| | | | | |
|---|---|---|---|---|
| 2010/0061115 | A1* | 3/2010 | Donahue | G02C 11/04 156/290 |
| 2012/0236599 | A1* | 9/2012 | Maeda | H02S 30/20 362/621 |
| 2016/0268962 | A1* | 9/2016 | Xue | B32B 3/08 |
| 2018/0372628 | A1 | 12/2018 | Craig et al. | |

FOREIGN PATENT DOCUMENTS

RU  2600087 C1 * 10/2016

OTHER PUBLICATIONS

Search English translation of RU-2600087-C1 (Year: 2016).*
Garment Decoration & Textile Printing Solutions uploaded Aug. 5, 2020 on YouTube, https://youtu.be/xWO1lg8KD48 (Year: 2020).*

* cited by examiner

*Primary Examiner* — Omar Rojas Cadima

(57) ABSTRACT

A method is disclosed. For example, the method includes printing an image on a substrate, applying an adhesive on select portions of the image, coupling the image to a wave guide such that the adhesive contacts a surface of the wave guide, and providing a light through the wave guide such that the light is emitted through the wave guide and the adhesive and the light is reflected by the select portions of the image back through the adhesive and the wave guide.

15 Claims, 5 Drawing Sheets

METHOD AND APPARATUS TO ADD LIGHT SOURCES TO A PRINT

The present disclosure relates generally to printing, and relates more particularly to adding light sources to a print.

BACKGROUND

Paintings and prints can be produced to illustrate or show an image. Paintings and prints can include different colors and textures. The colors that are viewed on a painting are a result of light reflecting off of pigments in the ink or paint. The pigments can "subtract" colors and present the viewer with the remaining light.

One feature of some paintings may be to make an object appear as if it is a light source. Some methods to achieve this visual effect may be to print directly onto a wave guide. However, expensive ultraviolet (UV) ink may be used to print directly on a wave guide. UV ink printers may be relatively expensive in that the printers dispense UV curable ink and then the ink passes under a UV lamp after printing to cure the UV curable ink. In addition, the size and thickness of the wave guide may make it difficult to manipulate in printers. Rather, large expensive printers that use UV ink may be required to print on these wave guides to achieve the desired visual effect.

SUMMARY

According to aspects illustrated herein, there are provided a method and a display device. One disclosed feature of the embodiments is a method that comprises printing an image on a substrate, applying an adhesive on select portions of the image, coupling the image to a wave guide such that the adhesive contacts a surface of the wave guide, and providing a light through the wave guide such that the light is emitted through the wave guide and the adhesive and the light is reflected by the select portions of the image back through the adhesive and the wave guide.

Another disclosed feature of the embodiments is a display device. The display device comprises a wave guide, a light source coupled to a perimeter of the wave guide to inject light into a plane of the wave guide, and an image printed on a substrate coupled to the wave guide via an adhesive applied to select portions of the image, wherein the light is emitted through the wave guide and the adhesive and the light is reflected by the select portions of the image back through the adhesive and the wave guide.

BRIEF DESCRIPTION OF THE DRAWINGS

The teaching of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present disclosure broadly discloses a method to add light sources to a print and display device having the same. As discussed above, one feature of some paintings may be to make an object appear as if it is a light source. Some methods to achieve this visual effect may be to print onto a wave guide directly. However, expensive ultraviolet (UV) ink may be used to print directly on a wave guide. In addition, the size and thickness of the wave guide may make it difficult to manipulate in printers. Rather, large expensive printers that use UV ink may be required to print on these wave guides to achieve the desired visual effect.

The present disclosure avoids the use of expensive printers that can handle large wave guides and/or expensive printers that use UV curable inks. Rather, the present disclosure allows light sources to be added to prints and/or paintings using inexpensive inks with cheaper printers.

In one embodiment, an adhesive can be selectively applied to the print. The clear adhesive can be applied to portions of the print where light sources, or the visual effect of light sources, should be added. The print may then be coupled to a wave guide. A light source may be added to create the display device. The portions of the print with the adhesive may reflect the light emitted from the light source. The resulting visual effect may appear as if the selected portions of the print are glowing or emitting light. Thus, the present disclosure provides a relatively inexpensive way to achieve a visual effect of light sources in a print.

Figure 1:
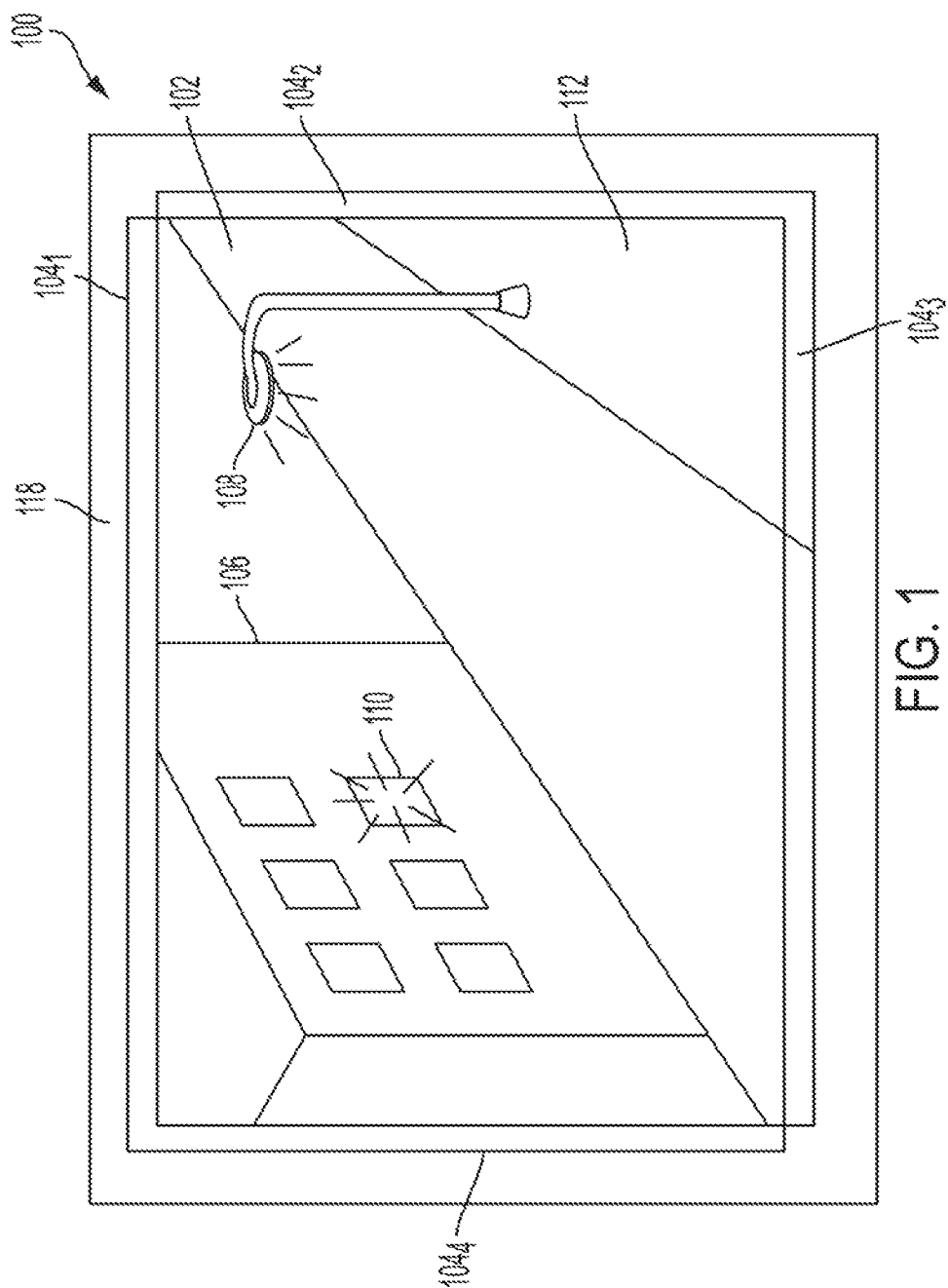
FIG. 1 illustrates an example display device of the present disclosure.

FIG. 1 illustrates an example display device 100 of the present disclosure. In one embodiment, the display device 100 may include an image 106 printed on a substrate 102. The substrate 102 may be paper, or any other type of media, that can be run through available printers, multi-function devices, and the like.

In one embodiment, the image 106 may be printed with non-ultra violet (UV) ink or ink that does not use UV light to cure the ink. For example, the image 106 may be printed with toner from a laser printer or printing fluid from an inkjet printer. As noted above, previous printing methods to produce light sources on printed images used expensive printers that dispense UV curable inks that were printed directly on a wave guide. The printers were relatively expensive as the printers also include UV light sources that are used to cure the UV curable inks. However, the present disclosure can use regular toner and/or ink to print the image 106 onto the substrate 102.

The image 106 may include images of light sources 108 and 110 (also referred to herein as select portions 108 and 110 of the image 106). The light sources 108 and 110 may be portions of the image that are intended to appear as if they are emitting light. For example, the light source 108 may be an image of a lamp on a street corner, the light source 110 may be light coming from a window of a building. The light sources may include other images, such as a sun, a moon at night, headlights of a car, and the like. Although two light sources 108 and 110 are illustrated in FIG. 1, it should be noted that the image 106 may include any number of images that represent light sources.

In one embodiment, the light sources 108 and 110 of the image 106 may appear as if they are emitting light in the display device 100. In other words, the light sources 108 and 110 may "glow" or appear to be "turned on" to emit light despite being printed images on the substrate 102.

In one embodiment, the substrate 102 may be coupled to a wave guide 112. The substrate 102 may be coupled via an adhesive that is applied to select portions of the image 106. The select portions may be the light sources 108 and 110 or any other portions of the image 106 that are to appear as light sources.

In one embodiment, light sources $104_1$ to $104_4$ (hereinafter also referred to individually as a light source 104 or collectively as light sources 104) may be coupled around a perimeter of the wave guide 112. The light sources $104_1$ to $104_4$ may be hidden by a frame 118 that is coupled around the light sources $104_1$ to $104_4$, the wave guide 112, and the substrate 102. Although four light sources $104_1$ to $104_4$ are illustrated in FIG. 1, it should be noted that any number of light sources may be deployed. For example, a single light source 104 may be deployed along one side of the perimeter of the wave guide 112, or two light sources 104 may be deployed on opposite sides of the wave guide 112, and so forth.

In one embodiment, the light sources $104_1$ to $104_4$ may be arrays of light emitting diodes (LEDs). As discussed in further details below, the light sources $104_1$ to $104_4$ may inject light into a plane of the wave guide 112. For example, the LEDs of the light sources $104_1$ to $104_4$ may be directed towards an edge of the wave guide 112 and inject light through a width (e.g., the thickness) of the wave guide 112.

Figure 2:
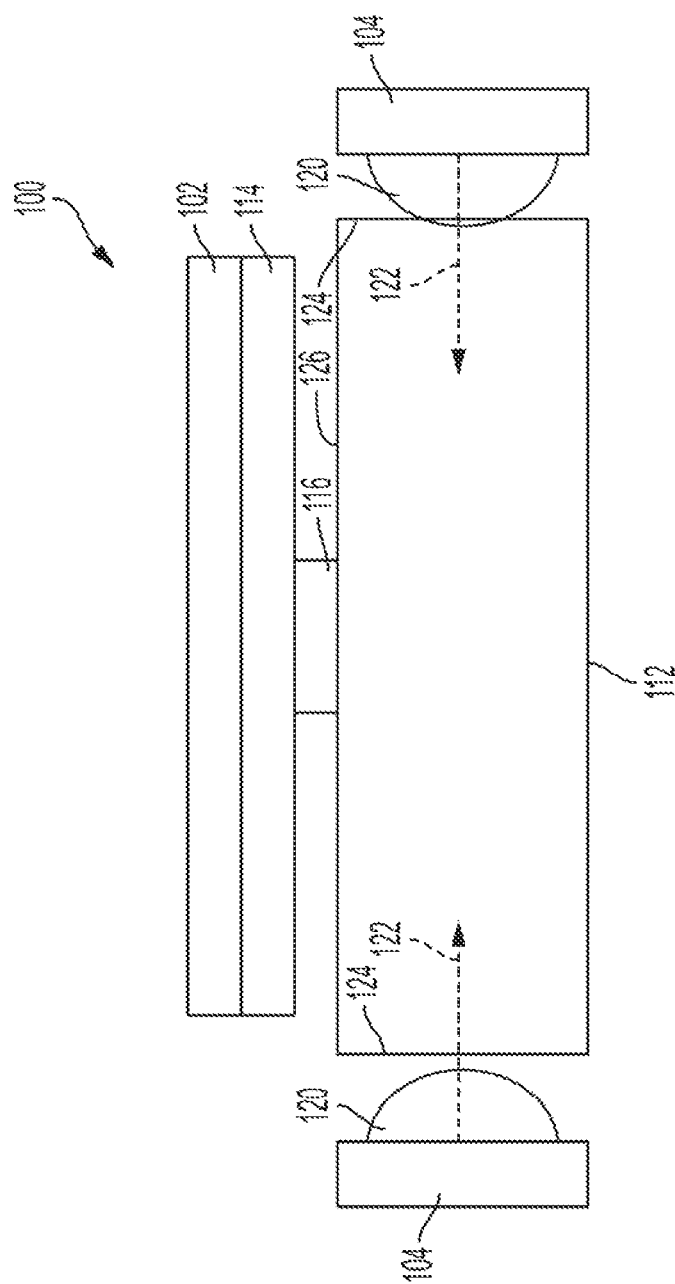
FIG. 2 illustrates a cross-sectional view of the display device of the present disclosure.

FIG. 2 illustrates a cross-sectional view of the display device 100 and illustrates how light is injected into the wave guide 112. FIG. 2 illustrates an example, where the light sources 104 include LEDs 120. The LEDs 120 may be positioned such that a central light emitting axis 122 of the LEDs 120 enters the cross-section and moves along a plane of the wave guide 112. In other words, the light emitted from the LEDs 120 may enter from sides 124 of the wave guide 112 (e.g., into the cross-sectional thickness of the wave guide 112).

The "plane" of the wave guide 112 may be a side or surface 126 that is coupled to an adhesive 116 and the substrate 102. The central light emitting axis 122 may be parallel to the side 126.

FIG. 2 also illustrates a layer 114 of the image 106 on the substrate 102. The layer 114 may be formed by toner or printing fluid/ink. Thus, the image 106 may be printed using a laser printer with toner or an inkjet printer with ink. In other words, as noted above, the image 106 can be printed without using expensive UV-curable inks and/or having to print directly onto the wave guide 112.

Figure 4:
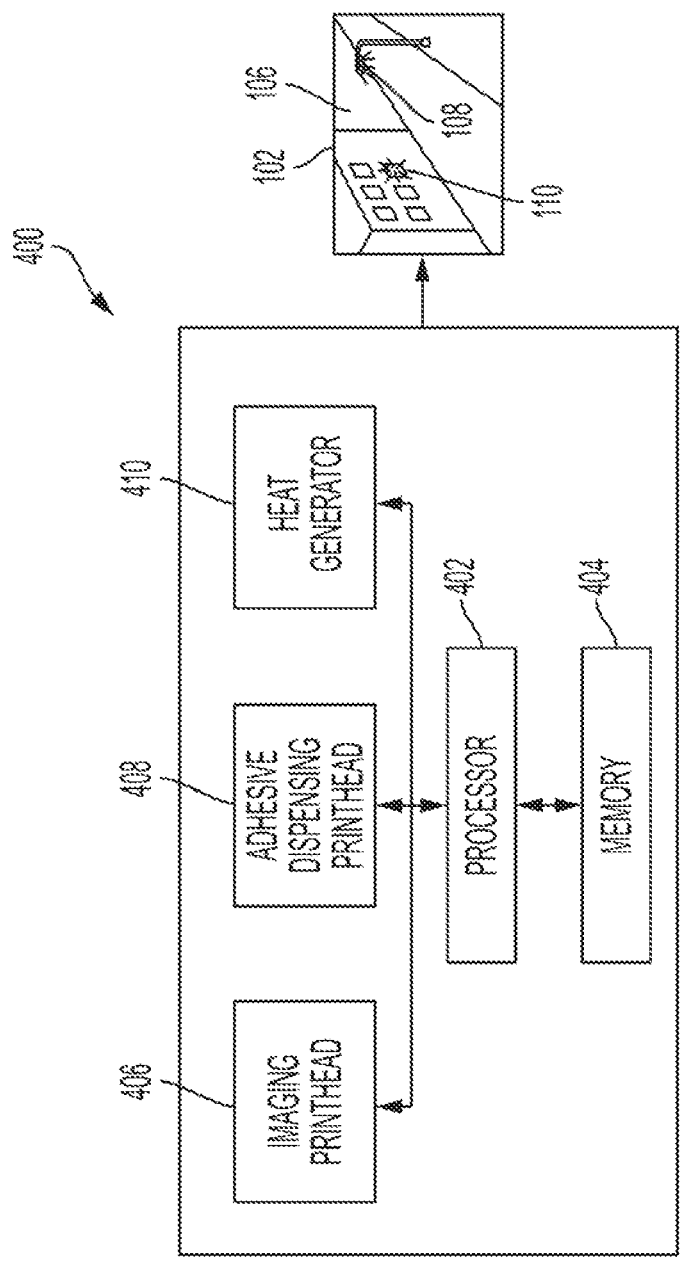
FIG. 4 illustrates an example apparatus of the present disclosure that generates an image for a print that includes light sources.

The adhesive 116 may be selectively applied to portions of the image 106 that are to be light sources (e.g., the select portions 108 and 110 of the image 106). In one embodiment, the adhesive 116 may be a clear glue or adhesive. The adhesive 116 may be a clear solvent based glue. For example, the solvent may be polyvinyl acetate. The adhesive 116 may be selectively applied (e.g., via digital control) using a printhead that dispenses the adhesive 116 on the select portions 108 and 110. An example of an apparatus modified with an adhesive dispensing printhead is illustrated in FIG. 4, and discussed in further details below.

In one embodiment, the adhesive 116 may be the layer 114 itself. For example, when the layer 114 comprises toner, the toner may be a form of a thermoplastic that can be heated to melt and then re-solidified to the surface 126 of the wave guide 112.

In one embodiment, the entire layer 114 may be heated to just below or at the melting temperature of the toner. The substrate 102 may be applied to the surface 126 of the wave guide 112 and allowed to cool. The toner may solidify and adhere to the surface 126 of the wave guide 112.

Heating the entire layer 114 may create issues with the quality of the image 106 that is printed. Thus, in one embodiment, the selection portions 108 and 110 may be locally heated to prevent image quality issues in other portions of the image 106. In some embodiments, an outer edge of the image 106 may also be heated to provide sufficient surface area of melted toner to adhere to the surface 126 of the wave guide 112.

In one embodiment, the adhesive 116 may be slightly colored with pigment. The pigment may provide an effect of different colored lights being emitted from the select portions 108 and 110 of the image 106. For example, yellow pigment may be added for the adhesive 116 added over an image of the sun. A blue pigment may be added for the adhesive 116 added over an image of a blue light source, and so forth.

In one embodiment, the adhesive 116 may change an index of refraction of the wave guide 112. For example, light that strikes the surface 126 may be reflected internally via total internal reflection (TIR). However, the adhesive 116 may have a different index of refraction than air and change the critical angle at which light is reflected internally. Thus, the total internal reflectance is frustrated (FTIR). As a result, light that strikes the surface 126 of the wave guide 112 where the adhesive 116 is located may continue through the surface 126 towards the layer 114 and the substrate 102 and be reflected back towards a user.

Figure 3:
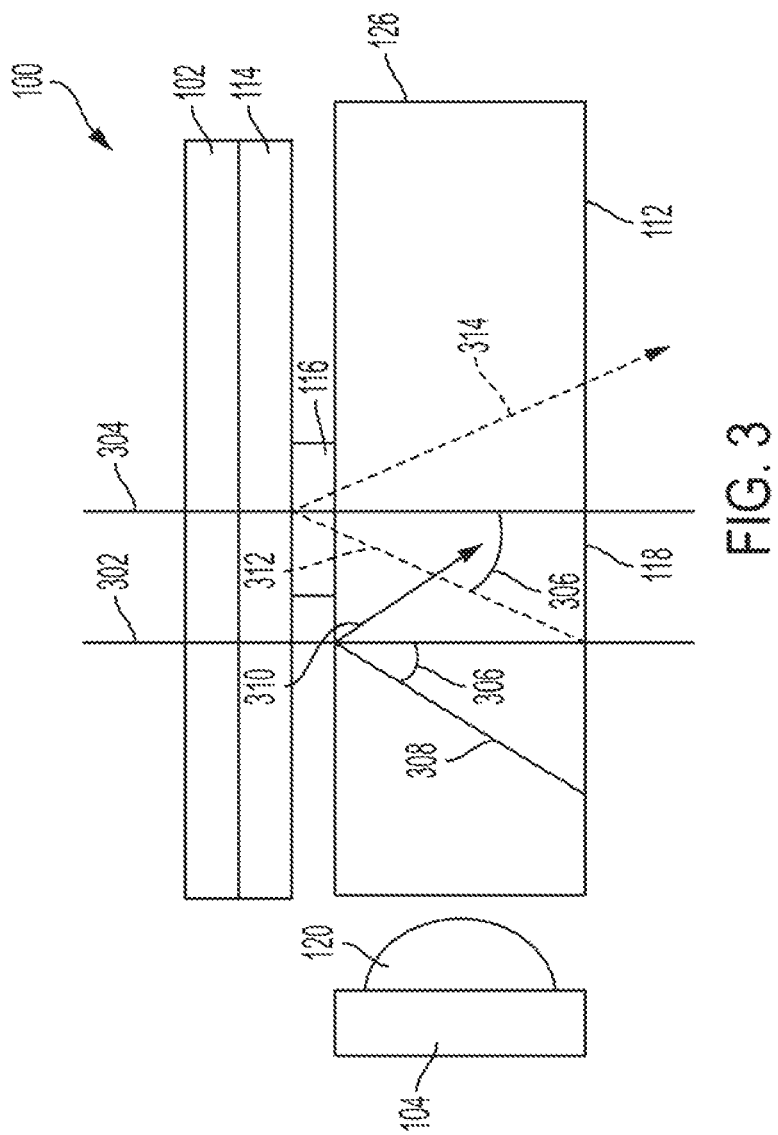
FIG. 3 illustrates a cross-sectional view that illustrates frustrated total internal reflection of how light exits at the lights sources of the print in the display device of the present disclosure.

FIG. 3 illustrates an example explanation of TIR and FTIR. For example, FIG. 3 illustrates an example of how the light emitted by the light sources 104 can create light sources in the select portions 108 and 110 of the image 106 printed on the substrate 102.

Light rays emitted by the LED 120 may enter the wave guide 112, as described above with reference to FIG. 2. Without the adhesive 116 contacting the surface 126 of the wave guide 112, the light emitted by the LED 120 may enter a first side and exit out the second side on the opposite cross-sectional end of the wave guide 112 via total internal reflection (TIR).

For example, the wave guide 112 may have an index of refraction of about 1.5 whereas air has an index of refraction of about 1.0. The differences in these indices of refraction enable the phenomena of total internal reflection. Using Snell's law of refraction, a critical angle 306 may be determined. The critical angle 306 may be a minimum angle of incidence for which light is totally reflected. For an air-glass interface, the critical angle 306 may be approximately 42 degrees. The critical angle 306 may be measured as the angle formed by a light ray 308 relative to a normal represented by a line 302. As illustrated in FIG. 3, light rays 308 that strike the surface 126 at an angle 306 that is 42 degrees or greater may be reflected internally as shown by a light ray 310.

However, the adhesive 116 may have a different index of refraction than air. For example, the index of refraction of the adhesive 116 may be approximately 1.35. As a result, the critical angle for the adhesive-glass interface may change, or be different, from the air-glass interface.

As shown in FIG. 3, when a light ray 312 strikes the surface 126 located over the adhesive 116 at the angle 306 (e.g., the same angle as the critical angle that the light ray 308 struck the surface 126), the light ray 312 may refracted through the wave guide 112 and into the adhesive layer 116 and the layer 114. The light ray 312 may be reflected by the substrate 102 and back through the adhesive layer 116 and into the wave guide 112. A light ray 314 illustrates how the light is reflected by the substrate 102 and/or layer 114 and scattered back into and out of the wave guide 112.

As a result, the select portions 108 and 110 of the image 106 may appear to a user viewing the display device 100 as being "on" or emitting light. In other words, the light refracted through the adhesive layer 116 and reflected by the portions 108 and 110 back towards the user may generate a visual effect that the printed images are emitting light or glowing.

FIG. 4 illustrates an example apparatus 400 of the present disclosure. In one embodiment, the apparatus 400 may include a processor 402, a memory 404, an imaging printhead 406, an adhesive dispensing printhead 408, and a heat generator 410. The processor 402 may be communicatively coupled to the memory 404, the imaging printhead 406, the adhesive dispensing printhead 408, and the heat generator 410. The processor 402 may control operation of the imaging printhead 406, the adhesive dispensing printhead 408, and the heat generator 410 in accordance with instructions that are stored in the memory 404.

In one embodiment, the memory 404 may be a non-transitory computer readable storage medium. For example, the memory 404 may be hard disk drive, a solid state drive, a random access memory (RAM), a read-only memory (ROM), and the like. The memory 404 may store instructions that are executed by the processor 402 to perform the functions described herein. For example, the instructions may include instructions to print the image 106, instructions to selectively dispense adhesive onto the select portions 108 and 110 of the image 106, selective apply heat (e.g., if toner is used to print the image 106), and so forth.

In one embodiment, the imaging printhead 406 may be a printhead to dispense toner for a laser printer or a printhead to dispense printing fluid for an inkjet printer. For example, the printhead may dispense cyan, magenta, yellow, and key (CYMK) colors for an inkjet printer.

In one embodiment, the adhesive dispensing printhead 408 may dispense the adhesive 116. The adhesive dispensing printhead 408 may dispense a clear adhesive. The clear adhesive may be a clear solvent based glue. For example, the solvent may be a polyvinyl acetate.

In one embodiment, the heat generator 410 may be a resistive heater. The heat generator 410 may include a heat sensor that can provide local temperature readings to the processor 402. The temperature sensor may provide a feedback loop that allows the processor 402 to control the amount of heat applied by the heat generator 410 to desired locations on the image 106. In one embodiment, the heat generator 410 may provide heat over the entire image 106.

As noted above, the heat generator 410 may be activated when the image 106 is printed with toner. The toner may be a thermoplastic that can be melted and then cooled to solidify and adhere to the wave guide 112. In other words, a separate adhesive may not be used when toner is used to print the image 106. Alternatively, if the adhesive 116 is applied, then the heat generator 410 may not be used or activated.

The apparatus 400 may be controlled by the processor 402 in accordance with the instructions stored in the memory 404 to produce the image 106 printed on the substrate 102. The substrate 102 may then be coupled to the wave guide 112 and assembled with the light sources 104 and the frame 110 to produce the display device 100 illustrated in FIG. 1, and discussed above.

It should be noted that the apparatus 400 has been simplified for ease of explanation and may include additional components that are not shown. For example, the apparatus 400 may include a communication interface to communicate with external computing devices to receive the digital image to be printed and where the light sources are located on the digital image. The apparatus 400 may include a user interface, digital front end to process the digital image into a printer description language, various paper transport paths, finishing modules, and the like.

Figure 5:
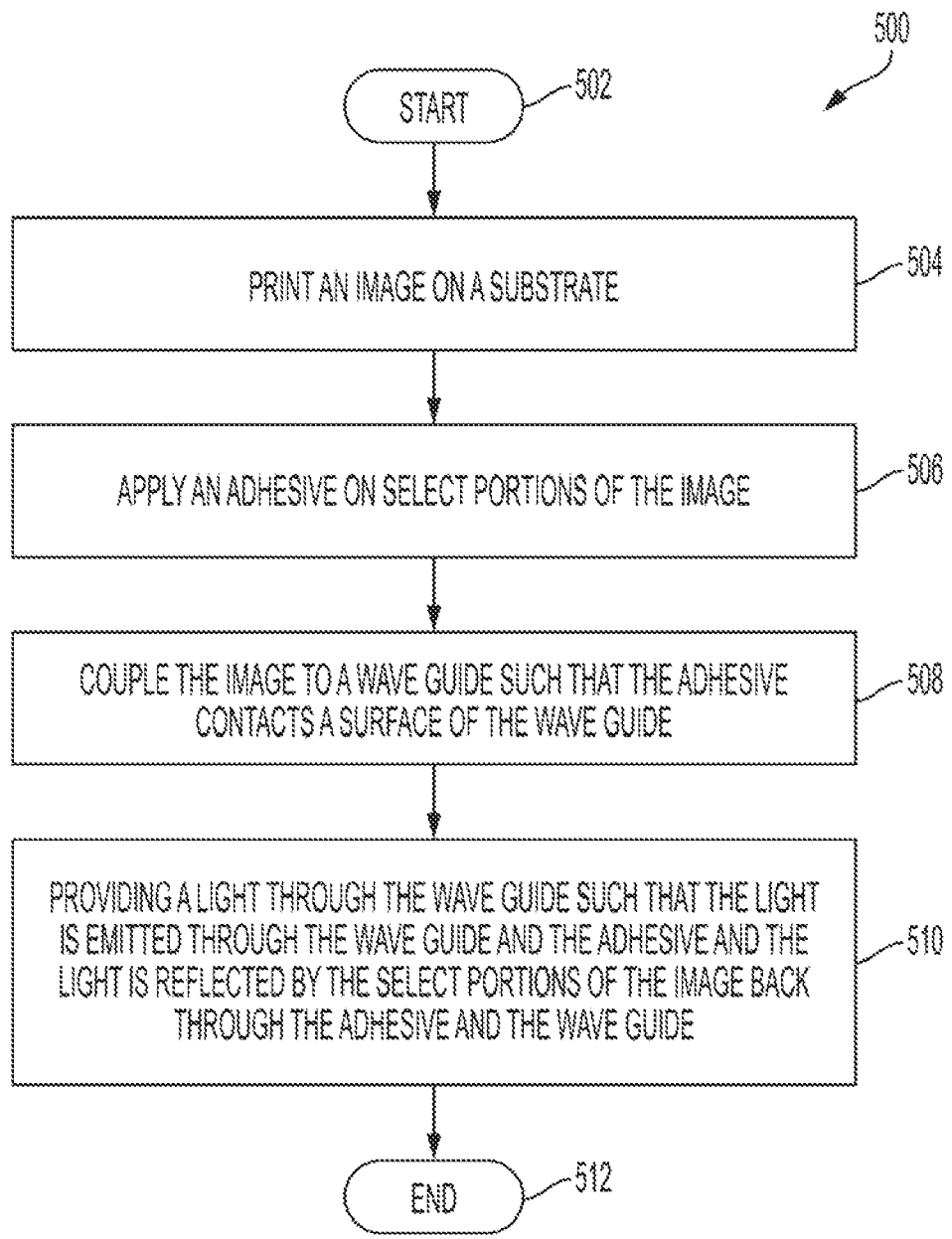
FIG. 5 illustrates an example flow chart of a method for generating a print with light sources of the present disclosure.

FIG. 5 illustrates a flow chart of an example method 500 for generating a print with light sources of the present disclosure. In one embodiment, portions of the method 500 may be performed by the apparatus 400 or a combination of various different apparatuses.

In one embodiment, the method 500 begins at block 502. At block 504, the method 500 prints an image on a substrate. For example, the substrate may be paper. The image may be an image that includes areas that represent a light source. For example, the image may include a print of a light post, a lamp in a window, the moon, the sun, headlights of an oncoming car, and the like.

In one embodiment, the image may be printed with toner or printing fluid or ink. For example, the image may be printed using a laser printer that applies toner to print the image or an inkjet printer that dispenses printing fluid to print the image.

Notably, the image is not printed with UV-curable ink that may be expensive or with UV curable ink printers that can be more expensive. In addition, the image is not printed directly onto glass or acrylic. Rather, the image is printed onto a paper substrate.

At block 506, the method 500 applies an adhesive on select portions of the image. In one embodiment, the adhesive may be applied via digital control of an adhesive dispensing printhead. FIG. 4 illustrates an example apparatus 400 that can be controlled to selectively dispense the adhesive.

The select portions of the image may include portions of the image that represent a light source. For example, the adhesive may be applied to an area that illustrates a lamp, a headlight, a light bulb, the moon, the sun, or any other light source.

In one embodiment, the adhesive may be a clear adhesive. For example, the adhesive may be a clear solvent based glue. The solvent may be polyvinyl acetate. In some embodiments, some pigment may be added to the adhesive. For example, the pigment may allow the light effect to be colored to have a yellow hue, a blue hue, and the like.

In one embodiment, the image may be printed with toner. When toner is used to print the image, the adhesive may be "applied" by heating the toner on the select portions of the image. For example, the select portions of the image may be locally heated to melt the toner. When, the toner is cooled and re-solidifies, the toner may adhere to a surface (e.g., the surface of the wave guide, as discussed below).

At block 508, the method 500 couples the image to a wave guide such that the adhesive contacts a surface of the wave guide. In one embodiment, after the image is printed, the substrate may be coupled to the wave guide such that the adhesive adheres the substrate to the surface of the wave guide. The coupling may be performed via robotic arm or assembly machine that is controlled by a processor.

The wave guide may be glass or a clear acrylic. The wave guide may have a thickness of at least 1/8 of an inch.

At block 510, the method 500 provides a light through the wave guide such that the light is emitted through the wave guide and the adhesive and the light is reflected by the select portions of the image back through the adhesive and the wave guide. In one embodiment, the light may be provided via a light source that is coupled to a perimeter of the wave guide. For example, arrays of LEDs may be coupled to the perimeter of the wave guide. The LEDs may be arranged such that a central light emitting axis emits light into the body of the wave guide and along a plane of the wave guide that is parallel to the substrate.

The light emitted by the light source may be totally internally reflected by the surface of the wave guide that has an air-wave guide interface. However, the TIR may be frustrated on portions of the surface of the wave guide that are in contact with the adhesive. Thus, light that strikes the surface of the wave guide with an adhesive-wave guide interface may be refracted into the adhesive and towards the layer of toner or ink on the substrate. The light may be reflected by the substrate and layer of toner or ink, back through the adhesive. The light may be then scattered back by the wave guide towards a viewer of the display device that has the printed image with light sources.

As a result, the light sources of the printed image may appear to be turned on. In other words, the printed image of light sources may glow and appear to be emitting light.

In one embodiment, a frame may be coupled to the light sources, the wave guide, and the substrate with the printed image. The light sources may be hidden by the frame. For example, the frame may have a channel to position the light sources around the perimeter of the wave guide. At block 510, the method 500 ends.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method, comprising:
    printing an image on a paper substrate with printing fluid;
    applying an adhesive on select portions of the image, wherein the select portions of the image comprise images that represent a light source, wherein the adhesive comprises a clear solvent based glue;
    coupling the image to a wave guide such that the adhesive contacts a surface of the wave guide; and
    providing a light through the wave guide such that the light is emitted through the wave guide and the adhesive and the light is reflected by the select portions of the image back through the adhesive and the wave guide.

2. The method of claim 1, wherein the applying is performed with a printhead.

3. The method of claim 1, wherein the solvent comprises polyvinyl acetate.

4. The method of claim 1, wherein the applying comprises:
    heating the select portions of the image to melt toner applied to the select portions of the image; and
    cooling the select portions to allow the toner to solidify and adhere to the wave guide.

5. The method of claim 1, wherein the light is provided by a light source coupled along a perimeter of the wave guide.

6. The method of claim 5, wherein the light is injected along a plane of the wave guide.

7. The method of claim 5, wherein the light source comprises light emitting diode (LED) arrays.

8. A display device, comprising:
    a wave guide;
    a light source coupled to a perimeter of the wave guide to inject a light into a plane of the wave guide; and
    an image printed with printing fluid on a paper substrate coupled to the wave guide via an adhesive applied to select portions of the image, wherein the select portions of the image comprise images that represent a light source, wherein the adhesive comprises a clear solvent based glue, wherein the light is emitted through the wave guide and the adhesive and the light is reflected by the select portions of the image back through the adhesive and the wave guide.

9. The display device of claim 8, wherein the wave guide comprises a clear acrylic or a glass substrate.

10. The display device of claim 8, wherein the wave guide has a thickness of at least 1/8 of an inch.

11. The display device of claim 8, wherein the light source comprises arrays of light emitting diodes (LEDs).

12. The display device of claim 8, wherein the solvent comprises polyvinyl acetate.

13. The display device of claim 8, wherein the adhesive comprises toner that is locally melted and re-solidified against the wave guide.

14. A method, comprising:
    printing an image on a paper substrate with printing fluid, wherein the image comprises images of light sources;
    applying a clear solvent based adhesive on select portions of the image, wherein the select portions of the image represent the light sources;
    coupling the image to a wave guide such that the clear solvent based adhesive contacts a surface of the wave guide, wherein the wave guide has a thickness of at least 1/8 of an inch; and
    coupling light emitting diode (LED) arrays around a perimeter of the wave guide such that the LED arrays emit a light through the wave guide along a plane of the wave guide such that the light is emitted through the wave guide and the clear solvent based adhesive and the light is reflected, via frustrated total internal reflection (FTIR), by the images of light sources of the image back through the clear solvent based adhesive and the wave guide.

15. The method of claim 14, wherein the applying is performed with a printhead.

* * * * *